(12) United States Patent
Pierce et al.

(10) Patent No.: US 10,734,565 B2
(45) Date of Patent: Aug. 4, 2020

(54) THERMOELECTRIC GENERATOR (71) Applicant: The Johns Hopkins University, Baltimore, MD (US)

(72) Inventors: Jonathan M. Pierce, Eldersburg, MD (US); Rama Venkatasubramanian, Cary, NC (US); Geza Dezsi, Durham, NC (US); Drew P. Seker, Baltimore, MD (US); Craig B. Leese, Sykesville, MD (US)

(73) Assignee: The Johns Hopkins University, Baltimore, MD (US)

( * ) Notice: Subject to any disclaimer, the term of this patent is extended or adjusted under 35 U.S.C. 154(b) by 133 days.

(21) Appl. No.: 15/852,660

(22) Filed: Dec. 22, 2017

(65) Prior Publication Data

US 2018/0248101 A1    Aug. 30, 2018

Related U.S. Application Data

(60) Provisional application No. 62/463,883, filed on Feb. 27, 2017.

(51) Int. Cl.
| | |
|---|---|
| *H01L 35/32* | (2006.01) |
| *H01L 35/30* | (2006.01) |
| *H01L 35/20* | (2006.01) |
| *H01L 35/02* | (2006.01) |
| *H01L 35/26* | (2006.01) |
| *F25B 21/02* | (2006.01) |

(52) U.S. Cl.
CPC ............ *H01L 35/325* (2013.01); *H01L 35/02* (2013.01); *H01L 35/20* (2013.01); *H01L 35/26* (2013.01); *H01L 35/30* (2013.01); *F25B 21/02* (2013.01)

(58) Field of Classification Search
CPC ......... H01L 35/02; H01L 35/06; H01L 35/30; H01L 35/32; H01L 35/325; H01L 35/34
See application file for complete search history.

(56) References Cited

U.S. PATENT DOCUMENTS

| | | | |
|---|---|---|---|
| 2010/0257871 A1* | 10/2010 | Venkatasubramanian | ................... H01L 23/38 62/3.7 |
| 2011/0284047 A1* | 11/2011 | Johnson | .................. A47J 33/00 136/205 |
| 2014/0026933 A1* | 1/2014 | Kell | ........................ H01L 35/32 136/205 |

\* cited by examiner

*Primary Examiner* — Daniel P Malley, Jr.
(74) *Attorney, Agent, or Firm* — Sung T. Kim (57) ABSTRACT

An electric generator device is provided that includes a thermoelectric array, a base plate, and an electric power output. The thermoelectric array may include a hot side portion and a cold side portion. The base plate may be configured to receive heat from a heat source to be transferred to the hot side portion of the thermoelectric array. The electric power output may be electrically coupled to the thermoelectric array. The thermoelectric array may be configured to convert a temperature differential into an electric voltage for output to the electric power output. The power generation housing may be configured to hold a heat rejection substance that absorbs heat from the cold side portion of the thermoelectric array to facilitate generation of the temperature differential between the hot side portion and the cold side portion of the thermoelectric array.

20 Claims, 7 Drawing Sheets

THERMOELECTRIC GENERATOR

CROSS-REFERENCE TO RELATED APPLICATIONS

This application claims the benefit of U.S. Provisional Application No. 62/463,883 filed on Feb. 27, 2017, the entire contents of which are hereby incorporated herein by reference.

STATEMENT REGARDING FEDERALLY SPONSORED RESEARCH OR DEVELOPMENT

This invention was made with Government support under contract number N00024-13-D-6400 awarded by the United States Department of the Navy. The Government has certain rights in the invention.

TECHNICAL FIELD

Example embodiments generally relate to electric generators and, more particularly, relate to electric generators based on solid state thermoelectric technology.

BACKGROUND

Electric power has become essential in almost all aspects of human activity. Electric power is used by a variety of devices to provide light, maintain food, communicate, and the like. Typically, electric power is provided by the power grid. However, in some situations and environments, electric power may not be readily available to operate electric devices or charge batteries. This may be the case during camping or survival situations, or when natural disasters strike that disrupt electric power delivery via the grid. In many of these situations, alternative energy sources may be available, such as thermal energy. However, thermal energy in itself is not useful for powering electric devices.

BRIEF SUMMARY OF SOME EXAMPLES

According to some example embodiments, an electric generator device is provided. The electric generator device may comprise a base plate configured to receive heat from a heat source, a thermoelectric array comprising a hot side portion and a cold side portion, an electric power output electrically coupled to the thermoelectric array, and a power generation housing operably coupled to the cold side portion of the thermoelectric array. The thermoelectric array may be configured to convert a temperature differential between the hot side portion and the cold side portion into an electric voltage for output to the electric power output. The hot side portion of the thermoelectric array may be operably coupled to the base plate to transfer heat from the base plate to the hot side portion of the thermoelectric array. The power generation housing may be configured to hold a heat rejection substance. The heat rejection substance may absorb heat from the cold side portion of the thermoelectric array to facilitate generation of the temperature differential between the hot side portion and the cold side portion of the thermoelectric array.

According to some example embodiments, an example electric generator system is provided. The electric generator system may comprise a base plate configured to receive heat from heat source, a thermoelectric array comprising a hot side portion and a cold side portion, an electric power output electrically coupled to the thermoelectric array, a power generation housing operably coupled to the cold side of the thermoelectric array, and a reservoir configured to contain a portion of the heat rejection substance. The reservoir may be operably coupled to the power generation housing. The thermoelectric array may be configured to convert a temperature differential between the hot side portion and the cold side portion into an electric voltage for output to the electric power output. The hot side portion of the thermoelectric array may be operably coupled to the base plate to transfer heat from the base plate to the hot side portion of the thermoelectric array. The thermoelectric array may comprise at least one thermoelectric module that comprises a superlattice structure having layers of a first semiconductor material interleaved with layers of a second semiconductor material. The thicknesses of the layers of the second semiconductor material may be non-uniform. The power generation module may be configured to contain a heat rejection substance. The heat rejection substance may absorb heat from the cold side portion of the thermoelectric array to facilitate generation of the temperature differential between the hot side portion and the cold side portion of the thermoelectric array. The reservoir may comprise a flexible tube including concertinaed sides configured to permit the tube to be in an extended configuration or a collapsed configuration.

According to some example embodiments, an example method is provided for generating electric power from thermal energy using an electric generator device including a cold side portion and a hot side portion of a thermoelectric array. The method may comprise receiving heat from a heat source at a base plate of the electric generator device and transferring the heat from the base plate to the hot side portion of the thermoelectric array. The method may also comprise absorbing, by a heat rejection substance contained by the electric generator device, heat received by the cold side portion of the thermoelectric array. The transferring and the absorbing may result in a temperature differential between the hot side portion and the cold side portion of the thermoelectric array. The example method may also comprise generating a direct current (DC) voltage on a power output in response to the temperature differential.

BRIEF DESCRIPTION OF THE SEVERAL VIEWS OF THE DRAWING(S)

Having thus described some the example embodiments in general terms, reference will now be made to the accompanying drawings, which are not necessarily drawn to scale, and wherein:

DETAILED DESCRIPTION

Some example embodiments now will be described more fully hereinafter with reference to the accompanying drawings, in which some, but not all example embodiments are shown. Indeed, the examples described and pictured herein should not be construed as being limiting as to the scope, applicability, or configuration of the present disclosure. Rather, these example embodiments are provided so that this disclosure will satisfy applicable legal requirements. Like reference numerals refer to like elements throughout.

As used herein the term "or" is used as the logical or where any one or more of the operands being true results in the statement being true. As used herein, the phrase "based on" as used in, for example, "A is based on B" indicates that B is a factor that determines A, but B is not necessarily the only factor that determines A.

According to various example embodiments, an electric generator device and associated methods are provided. In this regard, the electric generator device may operate to generate electric power in response to being exposed to a temperature differential. As such, the electric generator device may leverage thermal energy to generate electric energy or electric power. The electric generator device may include an array of thermoelectric modules that respond to a temperature differential between the thermoelectric array's "hot side" and "cold side" to form charge carriers and generate an electric voltage on an electric power output of the device. To facilitate creating the temperature differential, the hot side of the thermoelectric array may be exposed to a heat source (e.g., a campfire, a gas stove, or the like), and a cold side of the thermoelectric array may be exposed to a heat rejection substance (e.g., a fluid such as water) that operates to maintain or cool the temperature of the cold side of the thermoelectric array. The heat rejection substance may be disposed in a housing and reservoir that is operably coupled to the cold side of the thermoelectric array.

According to some example embodiments, an example electric generator device may be referred to as an Operational Lightweight Intelligent Thermo Electric (OLITE) power source. The example electric generator devices described herein may be useful in a variety of settings including camping, field operation, during severe weather, during natural or man-made disaster scenarios, or at other times when grid-based electric power or other electric power sources may be unavailable. In such situations, an example electric generator device may be used with a heat source that can be used to create a temperature differential at the example electric generator to generate electric power. Such heat sources may include, for example, campfires, camp stoves, gas cooking ranges (e.g., natural gas), wood chip burners, or the like that may use, for example, propone, butane, or other fuel. Further, example electric generator devices may be light-weight and portable (e.g., could fit in a rucksack or be hand carried), but may still be capable of providing substantial electric power. Example electric generator devices, as described herein, can be intuitively used and can be made quickly operational with the use of commonly available items, such as, a camp stove and water. According to some example embodiments, an electric generator device may provide, for example, 20 to 50 Watts of power and may be scalable to achieve other power output levels. As such, example electric generator devices may be useful in household, commercial, recreational, and military environments.

A variety of different loads may be served by an example electric generator device. In this regard, for example, commercial communication devices such as smart phones may be powered by an electric generator device, while also charging the battery of the smart phone. Emergency lights and medical equipment may also be served with electric power by an example electric generator device. Field computers, environment diagnostic sensors, small portable refrigerators (e.g., containing vaccines or the like) may also benefit from example embodiments. Example electric generator devices may also be useful to charge military-grade batteries and to power military communications equipment.

Example embodiments of electric generator devices may also have many benefits over conventional photovoltaic (PV) panel devices that offer only limited capabilities. For example, PV panels typically produce power only during daylight sun (e.g., 8-10 hours per day), whereas example embodiments of an electric generator device described herein may be used at any time when a heat source is available, including at night or at other times (or locations) when sunlight is limited or unavailable. Further, PV panels often do not produce rated power because sunlight can be obscured by cloud cover and rain. In contrast, the operation of some example electric generator devices described herein are not dependent on weather conditions or exposure to sunlight. Further, some example embodiments do not require cooling fans, pumps, and other mechanical cooling systems, and therefore operate without the assistance of complex systems requiring moving parts.

Figure 1:
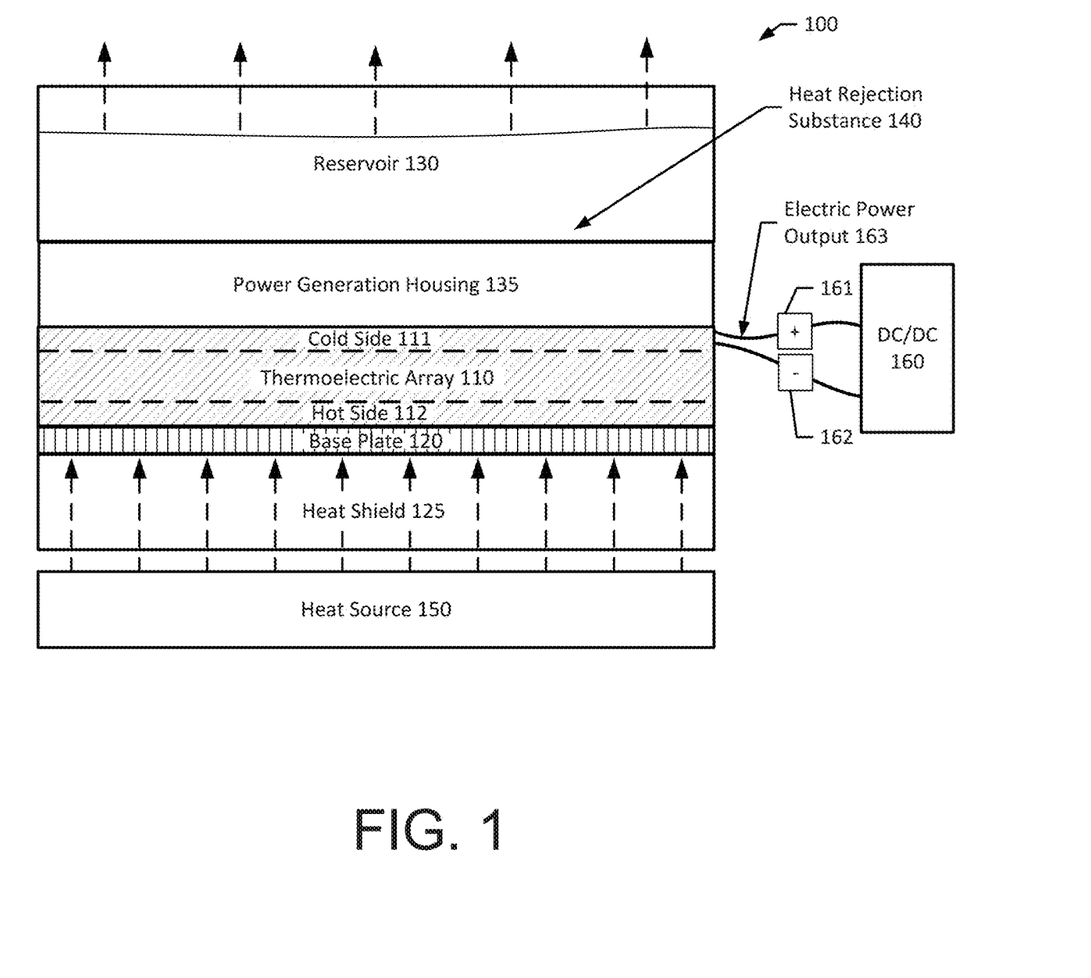
FIG. 1 shows an example electric generator device according to an example embodiment.

Accordingly, FIG. 1 shows a structural block diagram of an example electric generator device 100. As shown in FIG. 1, the electric generator device 100 may include a thermoelectric array 110, a base plate 120, a heat shield 125, a power generation housing 135, and a reservoir 130.

The thermoelectric array 110 may be a solid state device that, when exposed to a temperature differential, generates electric power. The thermoelectric array 110 may be formed of a plurality of thermoelectric couples (i.e., couples of n-type and p-type thermoelectric semiconductors) that are connected, for example, electrically in series and thermally in parallel. According to some example embodiments, the thermoelectric couples may also be referred to as thermoelectric modules. In this regard, the n-type element and p-type element of a thermoelectric couple may be electrically connected between the elements. To form connections to adjacent couples, the p-type element may be electrically connected to an n-type element of the next couple and the n-type element may be connected to the p-type element of a prior couple. These connections may be repeated for any number of thermoelectric couples to form the thermoelectric array 110 with the electrically connected ends of the series of thermoelectric couples being connected to lead wires, traces, or the like to form an electrical power output 163 of the thermoelectric array 110. The electrical connections amongst and between the thermoelectric couples may be formed by a material that operates both to electrically connect the thermoelectric couples and also conduct heat through the thermoelectric couples.

When heat is applied one side of a thermoelectric couple, the charge carriers (i.e., free electrons and holes) in the p-type and n-type elements are driven from the now hotter side of the thermoelectric couple towards the cooler side of the thermoelectric couple (i.e., the side not subjected to the applied heat). By driving the charge carriers in this manner, an electric current (i.e., a direct current) is created in the couple because of the existence of the temperature gradient. The direct current is polarized based on which side of the couple is the hot side and which side is the cold side. For purposes of describing the operation of the thermoelectric array 110 herein, the bottom portion of the thermoelectric array 110 (as shown in the figures) will be considered the hot side 112 and the top portion of the thermoelectric array 110 (as shown in the figures) will be considered the cold side 111. As such, the hot side 112 may be the side of the thermoelectric array 110 that is subjected to heat a source, which drives free charge carriers (i.e., free electrons and holes) in the thermoelectric semiconductor materials of the thermoelectric array 110 from the hot side 112 to the opposite, cold side 111. Thus, a temperature differential between the hot side 112 and the cold side 111 of the thermoelectric array 110 operates to create the direct current flow in the thermoelectric array 110 to generate electric energy that is output on electrical power output 163.

Accordingly, the thermoelectric array 110 may be configured to generate an electric potential difference or voltage, and thus a direct current, on an electric power output 163 of the thermoelectric array 110 in response to a higher temperature at the hot side 112 than at the cold side 111 of the thermoelectric array 110. The voltage or electric potential difference may be provided between leads or wires (e.g., between positive lead 161 and negative lead 162) of the electric power output 163. According to some example embodiments, when the electric generator device 100 is operating, the thermoelectric array 110 may be oriented such that the hot side 112 may include a lower portion of the thermoelectric array 110 in order to receive rising heat, and the cold side 111 may include an upper portion of the thermoelectric array 110 (e.g., as shown in the configuration of FIG. 1). Accordingly, the thermoelectric array 110 may be configured to convert a temperature differential between the hot side 112 and the cold side 111 into an electric voltage on the electric power output 163.

Heat from a heat source 150 may be transferred to the hot side 112 of the thermoelectric array 110 via an operable coupling to a base plate 120. The heat source 150 may include any source of thermal energy that is transferred, for example, by conduction, convection, radiation, or phase change. Heat may be transferred from the base plate 120 to the hot side 112 of the thermoelectric array 110. The base plate 120 may operate as a buffer (e.g., thermal and contaminant buffer) between the heat source 150 and the thermoelectric array 110, and may be configured to receive heat from the heat source 150. In this regard, the base plate 120 may receive heat from the heat source 150, and the base plate 120 may be configured to distribute the heat across the surfaces of the base plate 120 for the transfer of heat to the thermoelectric array 110. As such, the base plate 120 may operate to limit or reduce hot spots (e.g., areas of relatively higher temperature) on the hot side 112 of the thermoelectric array 110 that would have otherwise occurred in the absence of the base plate 120, and direct interaction between the heat source 150 and the thermoelectric array 110. According to some example embodiments, the base plate 120 may be formed of a thermally conductive material that distributes heat throughout the base plate 120 and the surfaces of the base plate 120. To facilitate more efficient heat transfer, the base plate 120 may have the same shape as the thermoelectric array 110, or the base plate 120 may be larger than the thermoelectric array 110. In this regard, the base plate 120 may have relatively broad surfaces that face both the heat source 150 and the thermoelectric array 110 to both distribute heat across those surfaces for transfer to the thermoelectric array 110. In this regard, the height of the base plate 120 may be substantially smaller than the width and length of the base plate 120 (e.g., a plate-like shape) to facilitate heat transfer from the heat source 150 to the thermoelectric array 110.

Additionally, the base plate 120 may protect the thermoelectric array 110 from contaminants and corrosives that may be expelled by the heat source 150. In this regard, in situations where the heat source 150 is, for example, a campfire, the soot and other substances released by the heat source 150 may be contaminants or corrosives that may damage the thermoelectric array 110 or inhibit efficient operation of the thermoelectric array 110. Accordingly, the base plate 120 may be comprised of a generally inert, non-corrosive substance. In this regard, the base plate 120 may be comprised of, for example, anodized aluminum or a titanium or copper.

The heat shield 125 may be affixed to and below the base plate 120 and may operate to direct or focus heat from the heat source 150 toward the base plate 120. In this regard, the heat shield 125 may have sides that extend down and away from the base plate 120 toward the heat source 150. The sides may form a cavity that receives and contains heat from the heat source 150. In other words, the heat shield 125 may include walls that extend away from the base plate 120 to form a cavity that focuses heat from the heat source 150 on the base plate 120. Additionally, the heat shield 125 may operate as a stand-off that permits the electric generator device 100 to be placed directly onto, for example, a burner of a gas stove such that the base plate 120 is not in physical contact with the burner apparatus. The heat shield 125 may be formed of a variety of materials including metals. Accordingly, the heat shield 125 may be operably coupled to the base plate 120.

According to some example embodiments, the electric generator device 100 may also include a power generation housing 135. The power generation housing 135 may hold at least a portion of a heat rejection substance 140 and perform a heat transfer function with respect to the cold side 111 of the thermoelectric array 110 to absorb heat from the cold side 111 to facilitate and maintain the temperature differential. The power generation housing 135 may have a base with the same dimensions as the cold side 111, and the base may be in physical contact with the cold side 111 of the thermoelectric array 110. By having a base of the power generation housing 135 with the same or substantially the same dimensions as the cold side 111 of the thermoelectric array 110, an interface surface area between the cold side 111 and the heat rejection substance 140 in the form of, for example, a fluid, within the power generation housing 135 may be maximized. As such, the power generation housing 135 may be affixed to or adjacent to the cold side 111 of the thermoelectric array 110 (i.e., above the thermoelectric array 110 in FIG. 1), and may operate to contain or hold a portion of the heat rejection substance 140 (e.g., fluid) within an inner cavity of the power generation housing 135. The power generation housing 135 may also include sides that extend upwards away from the cold side 111 of the thermoelectric array 110. Via the base and sides of the power generation housing 135, the power generation housing 135 may be operably coupled to the cold side 111 of the thermoelectric array 110. The operable coupling between the power generation housing 135 and the cold side 111 may be formed with the assistance of a thermal interface material (TIM) such as a graphite sheet disposed, for example, on the power generation housing 135. Additionally, the power generation housing 135 may be formed of a conductor such as a metal (e.g., aluminum).

In order to increase the quantity of heat rejection substance 140 that may be maintained in the electric generator device 100 (and therefore increase the ability to maintain or expel heat from the cold side 111), the capacity of the electric generator device 100 to hold the heat rejection substance 140 may be increased via the inclusion of a reservoir 130. The reservoir 130 may be affixed to the power generation housing 135 and may extend upwards and away from cold side 111 of the thermoelectric array 110. The reservoir 130 may be formed as a tube having a cross-sectional shape that is, for example, a circle, oval, square, rectangle, or the like. In this regard, the cross-sectional shape of the reservoir 130 at the connection site to the power generation housing 135 may have the same dimensions as the power generation housing 135 or the thermoelectric array 110. The reservoir 130 may be sealed to the power generation housing 135, which may be, in turn, sealed to the cold side 111 of the thermoelectric array 110. The reservoir 130 may be affixed to the power generation housing 135 via use of a flange. According to some example embodiments, sides of the reservoir 130 may be collapsible, as further described below, to reduce the overall size of the electric generator device 100 for storage or the like when not in use.

The heat rejection substance 140 may be any substance that absorbs or expels heat from a system. More specifically, the heat rejection substance 140 may absorb heat from the cold side 111 of the thermoelectric array 110, via the base and sides of the power generation housing 135, to facilitate generation of the temperature differential between the hot side 112 and the cold side 111 of the thermoelectric array 110. In this regard, the heat rejection substance 140 may operate to expel heat via, for example, a state change (e.g., solid to fluid, fluid to gas, or the like). According to some example embodiments, the heat rejection substance 140 may be fluid water. In example embodiments where fluid water is used, the cold side 111 of the thermoelectric array 110 may not reach temperatures colder than approximately 100 degrees Celsius, when the electric generator device 100 is operating. In this regard, the fluid water at 100 degrees Celsius may be boiling and the state change from fluid to gas may release heat, thereby cooling or maintaining the temperature of the cold side 111 of the thermoelectric array 110. Similarly, for example, the reservoir 130 may be filled with fluid water, and heat may be transferred from the cold side 111 of the thermoelectric array 110 to the fluid water, thereby cooling the temperature of the cold side 111. Additionally, the thermal transfer may cause the fluid water to change state to a gas via boiling. The heat transferred through the thermoelectric array 110 from the hot side 112 to the cold side 111 may include heat that is not converted into electric power by the thermoelectric array 110.

Alternatively, in some instances, the reservoir 130 may, for example, be filled with water in the form of ice or snow. Heat transferred from the cold side 111 of the thermoelectric array 110 may be received by the ice or snow, thereby cooling the temperature of the cold side 111. Heat provided via the cold side 111 may cause the ice or snow to change state to a fluid, thereby cooling the cold side 111. According to various other example embodiments, the heat rejection substance 140 may be formed of other substances such as, for example, paraffin wax, anti-freeze, mineral oil, other commonly available oils, or the like, which may have differing temperature characteristics.

To operate the electric generator device 100, the temperature on the hot side 112 of the thermoelectric array 110 should be higher, or even substantially higher, than the temperature on the cold side 111 of the thermoelectric array 110, thereby creating the temperature differential. In this regard, when the heat rejection substance 140 is fluid water and the water is brought to a boil, the temperature on the cold side 111 of the thermoelectric array 110 will be approximately 100 degrees Celsius, as mentioned above. If the thermoelectric array 110 is $Bi_2Te_3$-based, then the temperature on the hot side 112 often may not exceed about 300 degrees Celsius to, for example, avoid damage to the thermoelectric array 110. In example embodiments where the thermoelectric array 110 is comprised of half-Heusler (HH) materials or other high temperature thermoelectric materials, the hot side 112 of the thermoelectric array 110 may tolerate temperatures of 600 to 700 degrees Celsius, allowing for a higher temperature differential and, therefore, a higher power output for the electric generator device 100.

According to some example embodiments, the electric power output 163 may be a source of direct current (DC). The electric power output 163 may be operably connected to a DC to DC converter 160 to monitor and manage the electric voltage on the electric power output 163 to a converted desirable DC voltage. According to some example embodiments, the DC to DC converter 160 may be disposed within the power generation housing 135, thereby being included within an integrated electric generator device unit (unlike a unit where the DC to DC converter 160 is external and separately housed). Further, to protect the DC to DC converter 160, a low thermal conductance stand-off structure may be disposed between a power generation block (e.g., the base of the power generation housing 135 that is engaged with the thermoelectric array 110) and a power management block comprising the DC to DC converter 160 within an integrated package of the electric generator device 100.

As part of the power management block, the DC to DC converter 160 may be used to control (e.g., smooth) and output voltages and currents that can operate with a wide range of load devices. To support such load devices, the electric generator device 100 may output for example, 30 to 50 Watts of power. Via the DC to DC converter 160, the voltage provided by the thermoelectric array 110 on the electric power output 163 may be stepped up, stepped down, or otherwise controlled and maintained to obtain a desired output voltage from the DC to DC converter 160. According to some example embodiments, the voltage on the electric power output 163 may fluctuate based on the temperature differential on the thermoelectric array 110 at any given time. The DC to DC converter 160 may operate to reduce the degree of fluctuations and provide a more uniform output voltage. The circuitry of the power management block, including the DC to DC converter 160 and an integrated circuit controller chip (not shown), may be configured to enable maximum power transfer to a variety of loads (e.g., cell phones, cameras, medical devices, etc.).

Figure 2:
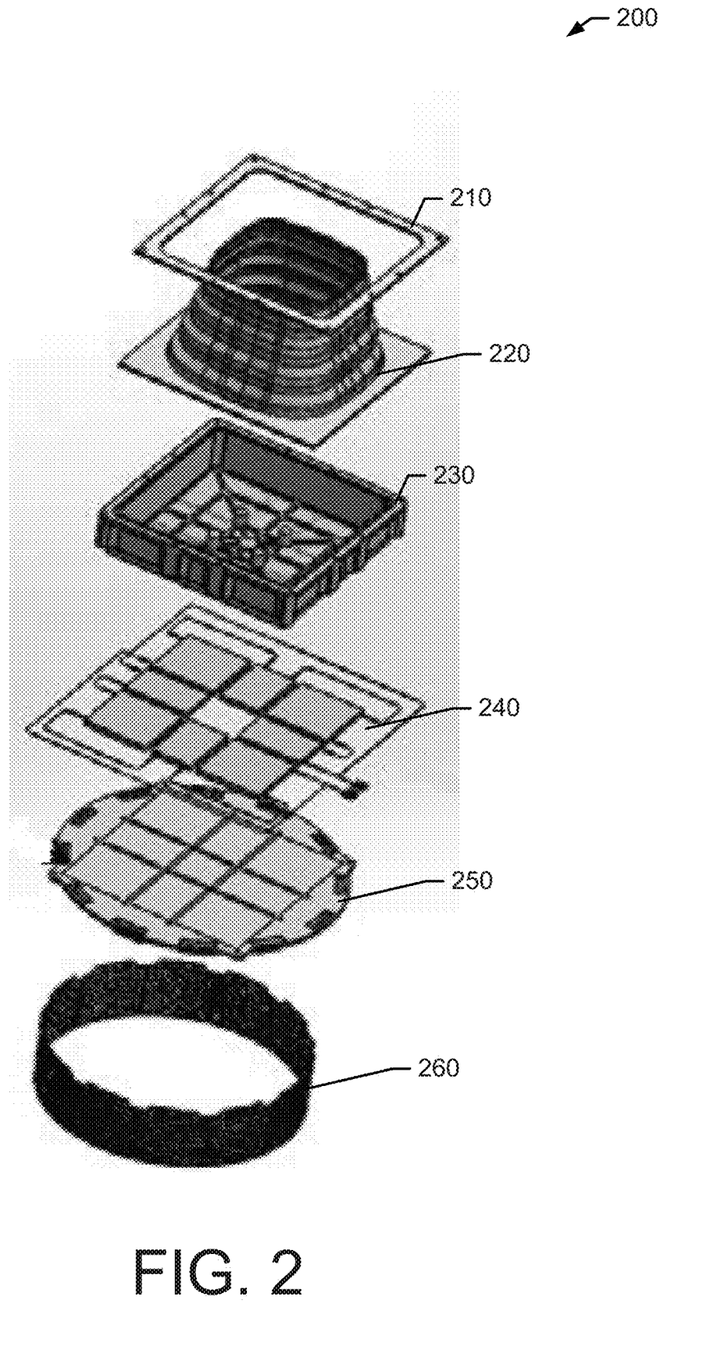
FIG. 2 shows an exploded view an electric generator device according to an example embodiment.
Figure 3:
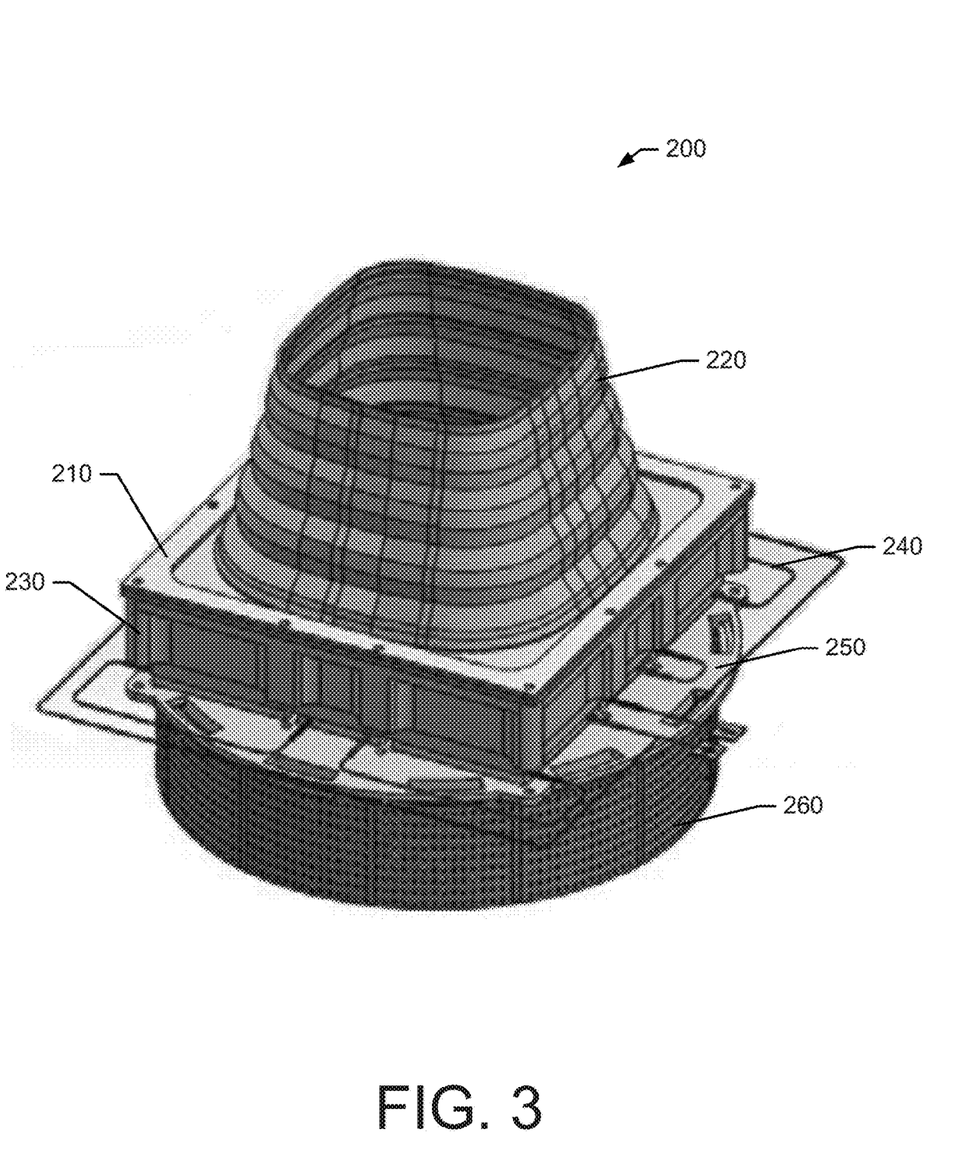
FIG. 3 shows a perspective view of an electric generator device according to an example embodiment.
Figure 4:
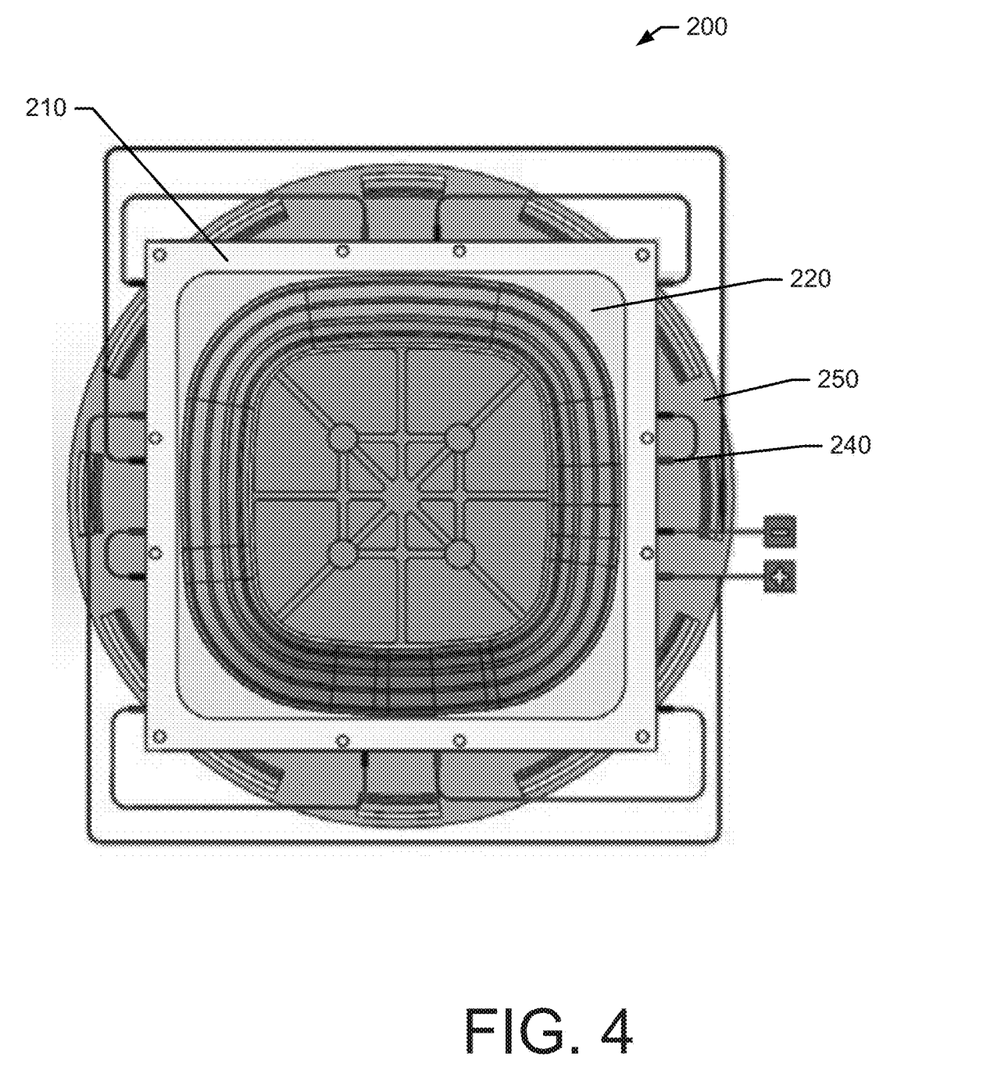
FIG. 4 shows a top view of an electric generator device according to an example embodiment.
Figure 5:
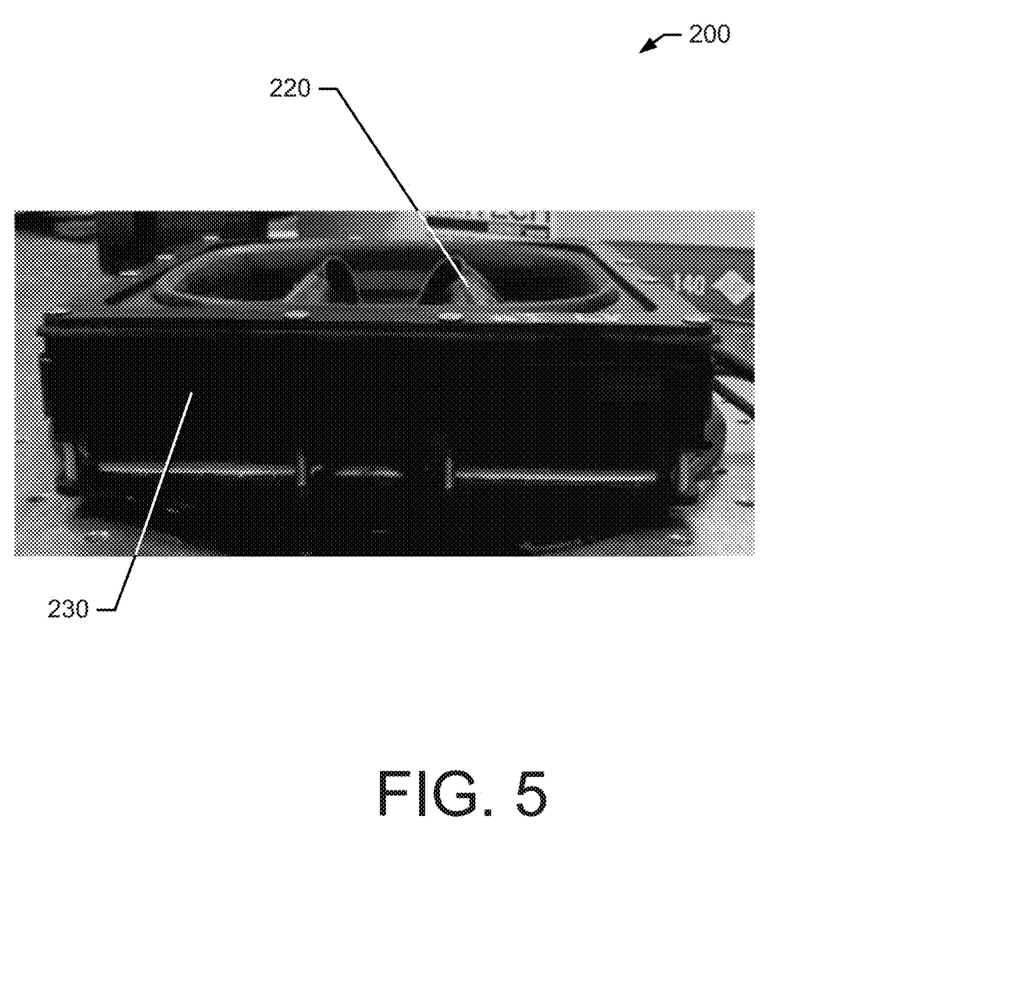
FIG. 5 shows a perspective side view of an electric generator device with a collapsed reservoir according to an example embodiment.

Referring now to FIGS. 2-5, another example embodiment of an electric generator device 200 is provided. FIG. 2 shows an exploded view of the electric generator device 200 according to an example embodiment. FIG. 3 shows a perspective view of the electric generator device 200 according to an example embodiment. FIG. 4 shows a top view of the electric generator device 200 according to an example embodiment. FIG. 5 shows a perspective side view of the electric generator device 200 with a collapsed reservoir according to an example embodiment.

The electric generator device 200 may comprise a flange 210, a reservoir 220, a power generation housing 230, a thermoelectric array 240, a base plate 250, and a heat shield 260. Many of the same components described with respect to electric generator device 100 are also employed in the electric generator device 200, albeit possibly in a different form.

The reservoir 220 may be one example of the reservoir 130 described above. The reservoir 220 may include features that permit the reservoir 220 to be compressed and collapsed into the power generation housing 230, to reduce the external profile and size of the electric generator device 200 when the electric generator device 200 is not in use and is being stored. The reservoir 220 may also be extended out of the power generation housing 230 to return to an operational position and state. In this regard, the reservoir 220 may be formed of a flexible tube made of, for example, rubber or polyester urethane.

In order to be collapsible, the sides of the reservoir 220 may be creased to form a plurality of collapsible rings to permit the walls to be readily folded into a collapsed configuration and expanded into an extended configuration. In this regard, the reservoir 220 may take the form of a tube having concertinaed sides. The concertinaed sides may be configured to permit the tube to be in an extended configuration or in a collapsed configuration. Further, the reservoir 220 may take the form of a bellows that is collapsible and extendable. According to some example embodiments, the dimensions of the top opening of the reservoir 220 may be smaller (i.e., the opening may be narrower) than the dimensions of the base of the reservoir 220. As such, according to some example embodiments, the reservoir 220, when extended, may have a conical shape. When collapsed, the reservoir 220 may fold into the power generation housing 230 as shown in FIG. 5 to be in a collapsed configuration. When expanded, the reservoir 220 may be in the extended configuration as shown in FIGS. 2-4. In the extended configuration, the electric generator device 100 may be ready for operation, and a heat rejection substance 140 may be poured or placed into the reservoir 220.

In an example embodiment, the reservoir 220 may be affixed to the power generation housing 230 via a flange 210. The flange 210 may be a ring that is placed on a lip of the reservoir 220 to provide strength to the connection between the reservoir 220 and the power generation housing 230. Fasteners (such as screws) may be installed through the flange 210, the lip of the reservoir 220, and into the power generation housing 230 to secure the reservoir 220 to the power generation housing 230.

The power generation housing 230 may be one example of the power generation housing 135 described above. In this regard, the power generation housing 230 may provide a cavity that reservoir 220 may collapse into, when moved into the collapsed configuration. The power generation housing 230 may also, according to some example embodiments, be sealed to both the thermoelectric array 240 and the reservoir 220 to contain, for example, a heat rejection substance 140 therein without leaking. Further, the power generation housing 230 may have walls that extend between the reservoir 220 and the thermoelectric array 240 and provide structural support and heat transfer capabilities to the electric generator device 200.

Further, the thermoelectric array 240 may be one example of the thermoelectric array 110 described with respect to FIG. 1. As shown in FIGS. 2-5, the thermoelectric array 240 may be disposed between the power generation housing 230 and the base plate 250. The thermoelectric array 240 may be comprised of a plurality of thermoelectric modules. These modules may be electrically connected together to increase the power output of electric generator device 200. Accordingly, while the thermoelectric modules may operate independently, the interconnected plurality of modules may offer more power output via higher voltages (if electrically in series) or higher currents (if electrically in parallel) when operating in the aggregate.

Figure 6:
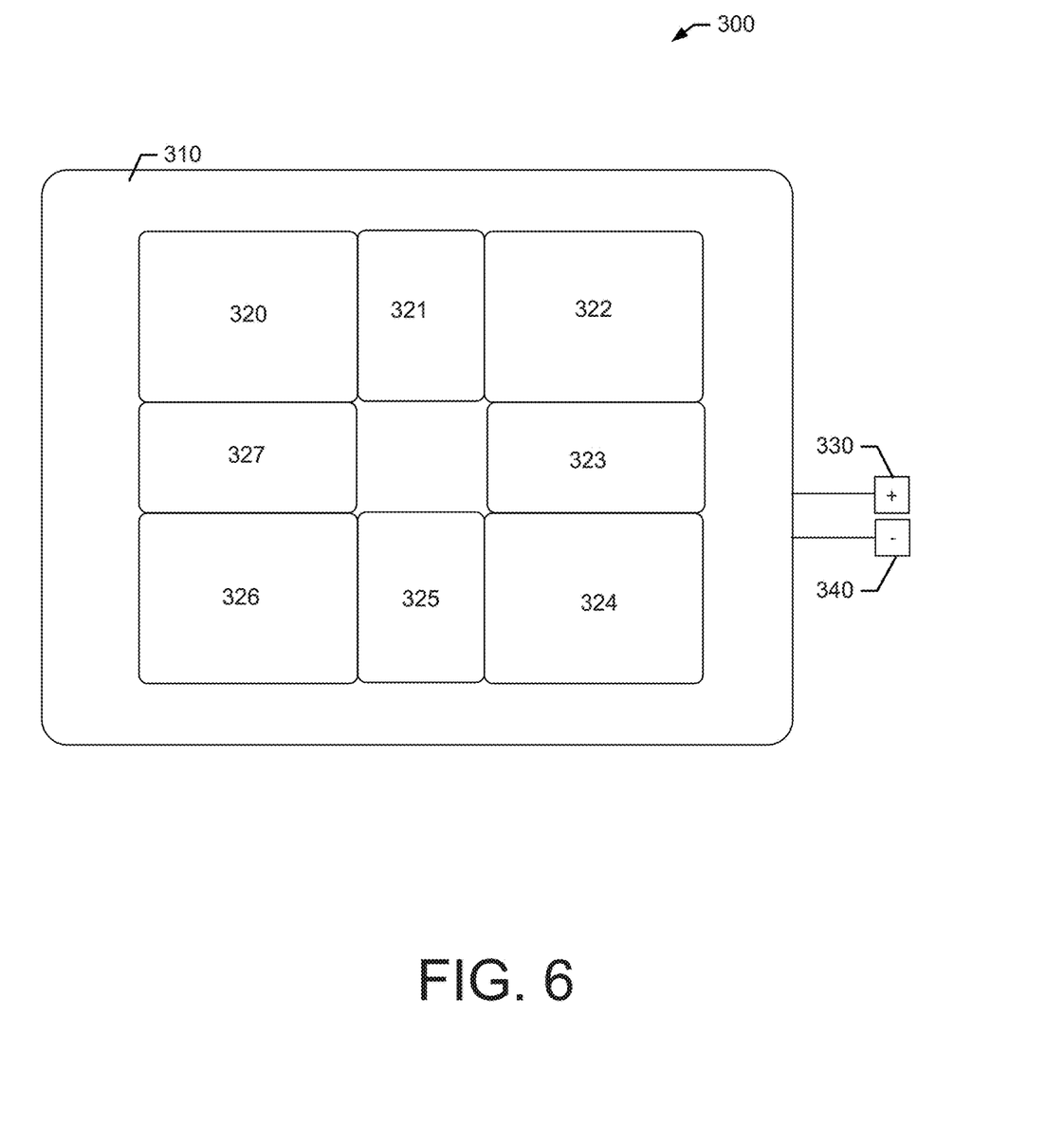
FIG. 6 shows a thermoelectric array according to an example embodiment.

An example embodiment of a thermoelectric array 300 with a plurality of interconnected thermoelectric modules is shown in FIG. 6. The thermoelectric array 300 may be comprised of the plurality of thermoelectric modules disposed on a substrate 310 with electric output leads 330 (positive) and 340 (negative). In this example embodiment, the plurality of thermoelectric modules includes eight thermoelectric modules (i.e., modules 320, 321, 322, 323, 324, 325, 326, and 327) aligned around (e.g., encircling) a center point of the substrate and the electric generator device 100. In this regard, because the thermoelectric modules may be comprised of thin-film nano-scale superlattice structures, the thermoelectric modules may be built on the substrate using techniques including Metal-Organic Chemical Vapour Deposition (MOCVD) or by Molecular Beam Epitaxy (MBE), or the thermoelectric modules may be made using bulk methods such as Bridgeman or Czochralski methods.

In this regard, the thermoelectric modules may have a superlattice structure with interleaved layers of semiconductor materials. According to some example embodiments, the thermoelectric modules may comprise a superlattice structure having layers of a first semiconductor material interleaved with layers of a second semiconductor material, wherein thicknesses of the layers of the second semiconductor material are not uniform. According to some example embodiments, the superlattice structure of the thermoelectric modules may be comprised of a plurality of periods (or superlattice periods or groupings of layers) disposed on a substrate. Each period may have two layers (bi-layer periods), where a first material (e.g., $Bi_2Te_3$) comprises the first layer and a second material (e.g., $Sb_2Te_3$) comprises the second layer. The materials of each layer may be, for example, semiconductor materials and may be doped p-type or n-type. Further, each layer may be formed to have a certain, predetermined thickness, and the thickness of the layers may cause the superlattice structure to have certain characteristics including thermoelectric characteristics. In this regard, according to some example embodiments, the thicknesses of the layers may vary throughout the periods and, in turn, the structure. According to some example embodiments, the superlattice structures of the thermoelectric modules may be referred to as a controlled hierarchical engineered superlattice structure (CHESS), which are described in U.S. patent application Ser. No. 15/700,263, entitled "SUPERLATTICE STRUCTURES FOR THERMOELECTRIC DEVICES", filed on Sep. 11, 2017, the content of which is hereby incorporated by reference in its entirety. Such superlattice structures may comprise a series of periods that are repeated within the superlattice structure, where such a series of periods is referred to as a band. In a CHESS structure, a band may be reproduced and repeated a number of times, possibly to reach a desired thickness for the overall structure (e.g., 3 to 30 microns). According to some example embodiments, such structures may have one or more p-n couples, where each p or n element (also referred to as a leg) of the couples may be a CHESS structure. P-type materials for CHESS structures may include $Bi_2Te_3$, $Sb_2Te_3$, $Bi_{2-x}Sb_xTe_3$, PbTe, PbSe, SnTe, SnSe, Si, Ge, $Si_{1-x}Ge_x$, GeTe, $Bi_xSb_{1-x}$, or SrTe, depending on temperatures of interest (e.g., 77K to 600K). Further, n-type materials for CHESS structures may include $Bi_2Te_3$, $Bi_2Se_3$, $Bi_2Se_xTe_{3-x}$, PbTe, PbSe, SnTe, SnSe, Si, Ge, $Si_{1-x}Ge_x$, GeTe, $Bi_xSb_{1-x}$, or SrTe depending on temperatures of interest (e.g., 77K to 600K).

Further, based on how the thermoelectric modules of the thermoelectric array 300 are interconnected, an electric generator device 200 or 100 may be configured to operate in a different power modes. For example, according to some example embodiments, an electric generator device 100 may implement a low voltage/high current (LV) mode or a high voltage/low current (HV) mode. For example, in the LV mode an example electric generator device may provide approximately 50 watts at about 7 amps and about 7 volts. On the other hand, in the HV mode an example electric generator device may provide approximately 50 watts at about 3.5 amps and 15 volts.

Additionally, the electric generator device 200 may also include a base plate 250 that is one example of the base plate 120 described with respect to FIG. 1. In this regard, the base plate 250 may be operably coupled to the thermoelectric array 240 to facilitate heat transfer from the base plate 250 to the thermoelectric array 240. As can be seen in FIG. 2, the base plate 250 may include cavities that are complementary to the shapes and physical positioning of the thermoelectric modules of the thermoelectric array 240 to further increase surface area engagement and thus heat transfer between the base plate 250 and the thermoelectric array 240.

Additionally, the base plate 250 may be affixed to the heat shield 260, which may be an example of the heat shield 125 described with respect to FIG. 1. In this regard, the heat shield 260 may be formed in a circular shape, similar to the circular shape of the base plate 250. As described above, the heat shield 260 may form a cavity to contain and focus heat from a heat source towards the base plate 250 to increase the temperature differential and the electric power output of the electric generator device 200.

Figure 7:
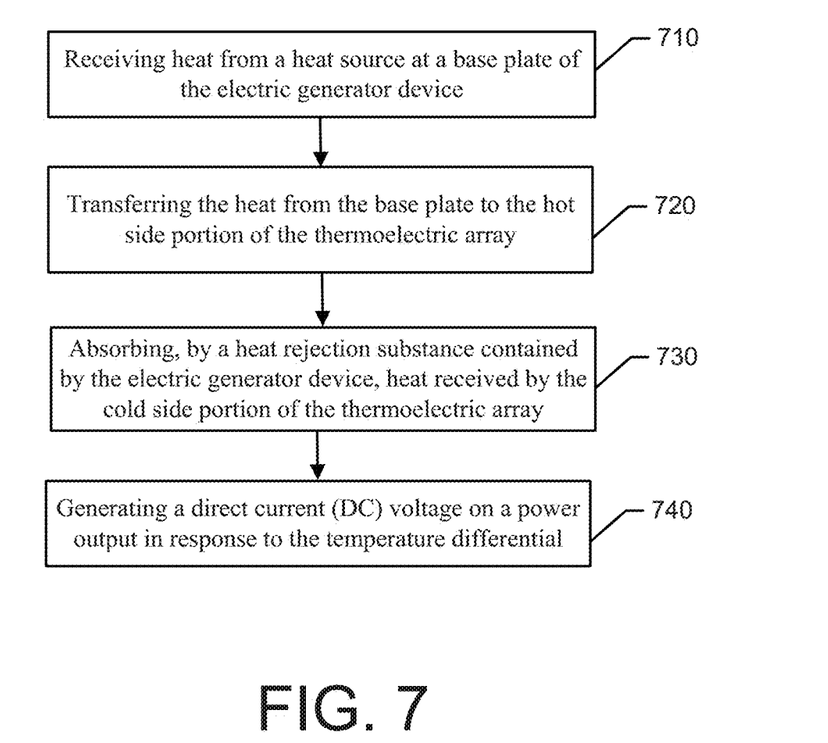
FIG. 7 shows flowchart of a method for generating electric power via an electric generator device according to an example embodiment.

According to some example embodiments, a method for generating electric power is provided in accordance with the flow chart of FIG. 7. According to the example method, electric power may be generated using an electric generator device that includes a cold side portion and a hot side portion of a thermoelectric array. In this regard, the example method may include receiving heat from a heat source at a base plate of the electric generator device at 710, and transferring the heat from the base plate to the hot side portion of the thermoelectric array at 720. The example method may further include absorbing, by a heat rejection substance contained by the electric generator device, heat received by the cold side portion of the thermoelectric array at 730. In this regard, the transferring and the absorbing may result in a temperature differential between the hot side portion and the cold side portion of the thermoelectric array. Further, at 740, the example method may include generating a direct current (DC) voltage on a power output in response to the temperature differential. Additionally, according to some example embodiments, the example method may include receiving the heat rejection substance into a power generation housing and a reservoir of the electric generator device, wherein the power generation housing is disposed adjacent to the cold side portion of the thermoelectric array. Additionally or alternatively, the example method may include electrically connecting a load to the power output of the thermoelectric array to provide electrical power to the load.

Many modifications and other embodiments of the invention set forth herein will come to mind to one skilled in the art to which the present application pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements or functions, it should be appreciated that different combinations of elements or functions may be provided by alternative embodiments without departing from the scope of the appended claims. In this regard, for example, different combinations of elements or functions than those explicitly described above are also contemplated as may be set forth in some of the appended claims. In cases where advantages, benefits or solutions to problems are described herein, it should be appreciated that such advantages, benefits or solutions may be applicable to some example embodiments, but not necessarily all example embodiments. Thus, any advantages, benefits or solutions described herein should not be thought of as being critical, required or essential to all embodiments or to that which is claimed herein. Although specific terms are employed herein, they are used in a generic and descriptive sense only and not for purposes of limitation.

That which is claimed:

1. An electric generator device comprising:
    a base plate configured to receive heat from a heat source;
    a thermoelectric array comprising a hot side portion and a cold side portion;
    an electric power output electrically coupled to the thermoelectric array;
    a power generation housing operably coupled to the cold side portion of the thermoelectric array; and
    a reservoir sealed to the power generation housing and configured to hold a heat rejection substance, the reservoir comprising a conical shaped tube having concertinaed sides;
    wherein the thermoelectric array is configured to convert a temperature differential between the hot side portion and the cold side portion into an electric voltage for output to the electric power output, wherein the hot side portion of the thermoelectric array is operably coupled to the base plate to transfer heat from the base plate to the hot side portion of the thermoelectric array;
    wherein the power generation housing is also configured to hold the heat rejection substance, wherein the heat rejection substance absorbs heat from the cold side portion of the thermoelectric array to facilitate generation of the temperature differential between the hot side portion and the cold side portion of the thermoelectric array.

2. The electric generator device of claim 1, wherein the electric power output is a source of direct current (DC) and wherein the electric generator device further comprises a DC to DC converter to increase or decrease the electric voltage on the electric power output to a converted DC voltage.

3. The electric generator device of claim 1, wherein the base plate comprises anodized aluminum, copper, or titanium.

4. The electric generator device of claim 1, wherein the tube is a flexible tube.

5. The electric generator device of claim 4, wherein the reservoir is configured to permit the tube to be in an extended configuration or a collapse configuration.

6. The electric generator device of claim 1, wherein the thermoelectric array comprises a plurality of interconnected thermoelectric modules disposed on a common substrate.

7. The electric generator device of claim 6, wherein the thermoelectric modules each comprise a superlattice structure having interleaved layers of semiconductor materials.

8. The electric generator device of claim 7, wherein the superlattice structure comprises layers of a first semiconductor material interleaved with layers of a second semiconductor material, wherein thicknesses of the layers of the second semiconductor material are not uniform.

9. The electric generator device of claim 1, wherein the heat rejection substance comprises at least one of fluid water, paraffin wax, antifreeze, or oil.

10. The electric generator device of claim 1, further comprising a heat shield operably coupled to the base plate, wherein the heat shield includes walls that extend away from the base plate to form a cavity that focuses heat from the heat source on the base plate.

11. The electric generator device of claim 1, wherein the power generation housing comprises structural support walls configured to form a cavity to hold a portion of the heat rejection substance.

12. The electric generator device of claim 11, wherein the tube of the reservoir is configured to fold into the cavity formed by structural support walls of the power generation housing in the collapsed configuration.

13. The electric generator device of claim 1, wherein thermoelectric array comprises a plurality of thermoelectric modules; and
wherein the base plate comprises a plurality of cavities that are complementary to shapes and physical positioning of the thermoelectric modules, the plurality of cavities being configured to receive the plurality of thermoelectric modules to provide surface area engagement between the thermoelectric modules and the base plate.

14. The electric generator device of claim 1, wherein the operable coupling between the power generation housing and the cold side of the thermoelectric array comprises a thermal interface material including a graphite sheet.

15. An electric generator system comprising:
a base plate configured to receive heat from a heat source;
a thermoelectric array comprising a hot side portion and a cold side portion;
an electric power output electrically coupled to the thermoelectric array;
a power generation housing operably coupled to the cold side portion of the thermoelectric array; and
a reservoir configured to contain a portion of a heat rejection substance, the reservoir being operably coupled to the power generation housing;
wherein the thermoelectric array is configured to convert a temperature differential between the hot side portion and the cold side portion into an electric voltage for output to the electric power output;
wherein the hot side portion of the thermoelectric array is operably coupled to the base plate to transfer heat from the base plate to the hot side portion of the thermoelectric array;
wherein the thermoelectric array comprises at least one thermoelectric module comprising a superlattice structure having layers of a first semiconductor material interleaved with layers of a second semiconductor material, wherein thicknesses of the layers of the second semiconductor material are not uniform;
wherein the power generation module is configured to contain the heat rejection substance, wherein the heat rejection substance absorbs heat from the cold side portion of the thermoelectric array to facilitate generation of the temperature differential between the hot side portion and the cold side portion of the thermoelectric array; and
wherein the reservoir comprises a conical shaped flexible tube including concertinaed sides configured to permit the tube to be in an extended configuration or a collapsed configuration.

16. The electric generator system of claim 15, wherein the heat rejection substance comprises at least one of fluid water, paraffin wax, antifreeze, or oil.

17. The electric generator system of claim 15, further comprising a heat shield operably coupled to the base plate, wherein the heat shield includes walls that extend away from the base plate to form a cavity that focuses heat from the heat source on the base plate.

18. The electric generator system of claim 15, wherein the electric power output is a source of direct current (DC) and wherein the electric generator system further comprises a DC to DC converter to adjust the electric voltage on the electric power output to a converted DC voltage.

19. The electric generator system of claim 15, wherein the base plate comprises anodized aluminum, copper, or titanium.

20. The electric generator system of claim 15, wherein the thermoelectric array comprises a plurality of interconnected thermoelectric modules disposed on a common substrate.

* * * * *